United States Patent [19]
Walden

[11] 3,989,956
[45] Nov. 2, 1976

[54] CHARGE TRANSFER BINARY COUNTER

[75] Inventor: Robert Henry Walden, New Providence, N.J.

[73] Assignee: Bell Telephone Laboratories, Incorporated, Murray Hill, N.J.

[22] Filed: Apr. 18, 1975

[21] Appl. No.: 569,273

Related U.S. Application Data

[63] Continuation-in-part of Ser. No. 470,550, May 16, 1974, abandoned.

[52] U.S. Cl. .................... 307/221 D; 307/225 C; 307/304; 357/24
[51] Int. Cl.² ................ H01L 27/10; H03K 25/02; H03K 23/30
[58] Field of Search....... 357/24; 307/221 C, 221 D, 307/221 R, 220 R, 220 C, 224 R, 224 C, 225 R, 225 C, 304

[56] References Cited
UNITED STATES PATENTS
3,777,186  12/1973  Chang.................................. 357/24

OTHER PUBLICATIONS
Mok et al., *Electronics Letters*, vol. 8, No. 20, Oct. 5, 1972, pp. 495–496.
Hibberd, *Integrated Circuits*, (TI Electronics Series, McGraw–Hill, NY, 1969) pp. 114–117.

*Primary Examiner*—William D. Larkins
*Attorney, Agent, or Firm*—Michael J. Urbano

[57] ABSTRACT

A two-phase charge transfer binary counter capable of counting the number of signal pulses in a particular time interval is described. The counter includes a charge storage medium in which is formed at least one charge storage "Q-cell" adapted to quantize each signal pulse into a charge packet. In tandem with the Q-cells are a plurality of one-bit shift registers each of which, except the last, comprises first and second charge storage cells connected in series. Adjacent cells of the same shift register are separated from one another by a threshold potential barrier of magnitude $V_T$ which permits only partial charge transfer thereacross. In contrast, adjacent cells of consecutive shift registers are separated from one another by a smaller transfer potential barrier of magnitude $V_B$ which permits virtually complete charge transfer thereacross. A feedback path is established between adjacent cells of the same shift register in order to clear residual charge from the first cell in response to charge transferred over its threshold barrier. At the end of the time interval, however, charge transfer ceases and the charge packets residing in the first cell of each shift register are the binary equivalent to the number of signal pulses in the time interval.

18 Claims, 8 Drawing Figures

CHARGE TRANSFER BINARY COUNTER

CROSS REFERENCE TO RELATED APPLICATIONS

This application is a continuation-in-part of application Ser. No. 470,550 filed on May 16, 1974 (now abandoned) which was filed concurrently with both application Ser. No. 470,546 entitled "Charge Transfer Logic Gate" (now U.S. Pat. No. 3,919,564 issued on Nov. 11, 1975) and application Ser. No. 470,511 entitled "Charge Transfer Delay Line Filters"abandoned in favor of a c-i-p application which is now U.S. Pat. No. 3,944,850 issued Mar. 16, 1976).

BACKGROUND OF THE INVENTION

This invention relates to charge transfer devices and, more particularly, to change coupled devices (CCDs) for performing a binary counting function.

The recent emergence of charge coupled technology has brought with it the advent of shift register and memory devices now well known in the art. In order to fabricate complete systems, other circuit functions are frequently utilized. By way of illustration, such supplementary functions often include logical AND and OR, binary counting, anad signal filtering. Advantageously, if all of the circuits performing the various functions of the system are charge coupled devices, the manufacture of the system is simplified. A shift register and an AND gate, for example, could be fabricated on a single chip by well-known integrated circuit technology. Moreover, interface problems, such as impedance matching and loading due to stray capacitance, would be alleviated.

SUMMARY OF THE INVENTION

The invention is a charge transfer binary counter capable of counting the number (from 0 to $2^n - 1$) of charge packets in a particular time interval. The charge packets might, for example, be generated from signal pulses in a PCM system and the time interval might constitute a "word" or frame in PCM terminology. In an illustrative embodiment the binary counter comprises a charge storage medium in which is formed at least one charge storage "Q-cell" adapted to quantize each signal pulse into a packet of charge Q. In tandem with the Q-cells are $n$ one-bit shift registers each of which, except perhaps the last, comprises first and second charge storage cells connected in series. Adjacent cells of the same shift register are separated from one another by a threshold potential barrier of magnitude $V_T$ which permits only partial transfer of charge thereacross. On the other hand, adjacent cells of consecutive shift registers are separated from one another by a smaller potential barrier of magnitude $V_B$ which permits virtually complete charge transfer thereacross. In a preferred embodiment, $V_T$ is approximately equal to 1.5 $V_B$ if the Q-cells are of area A and at least the first cells of each shift register each have an area equal to 2A. Adjacent cells of the device are connected to opposite phases of a two-phase clock. A feedback path is established between adjacent cells of the same shift register in order to clear residual charge from the first cell whenever charge is transferred across its threshold barrier. At the end of the particular time interval (e.g., word or frame), however, a quasi-steady state is reached; that is, charge transfer ceases until a read operation is performed or the next word arrives. In the quasi-steady state, charge packets residing in the first cells of the shift registers correspond to the binary equivalent of the number of signal pulses in the word.

BRIEF DESCRIPTION OF THE DRAWING

The invention, together with its various features and advantages, can be easily understood from the following more detailed description taken in conjunction with the accompanying drawing, in which:

FIG. 3A shows schematically the quantizer and the first shift register of FIG. 2, whereas

DETAILED DESCRIPTION

Figure 1:
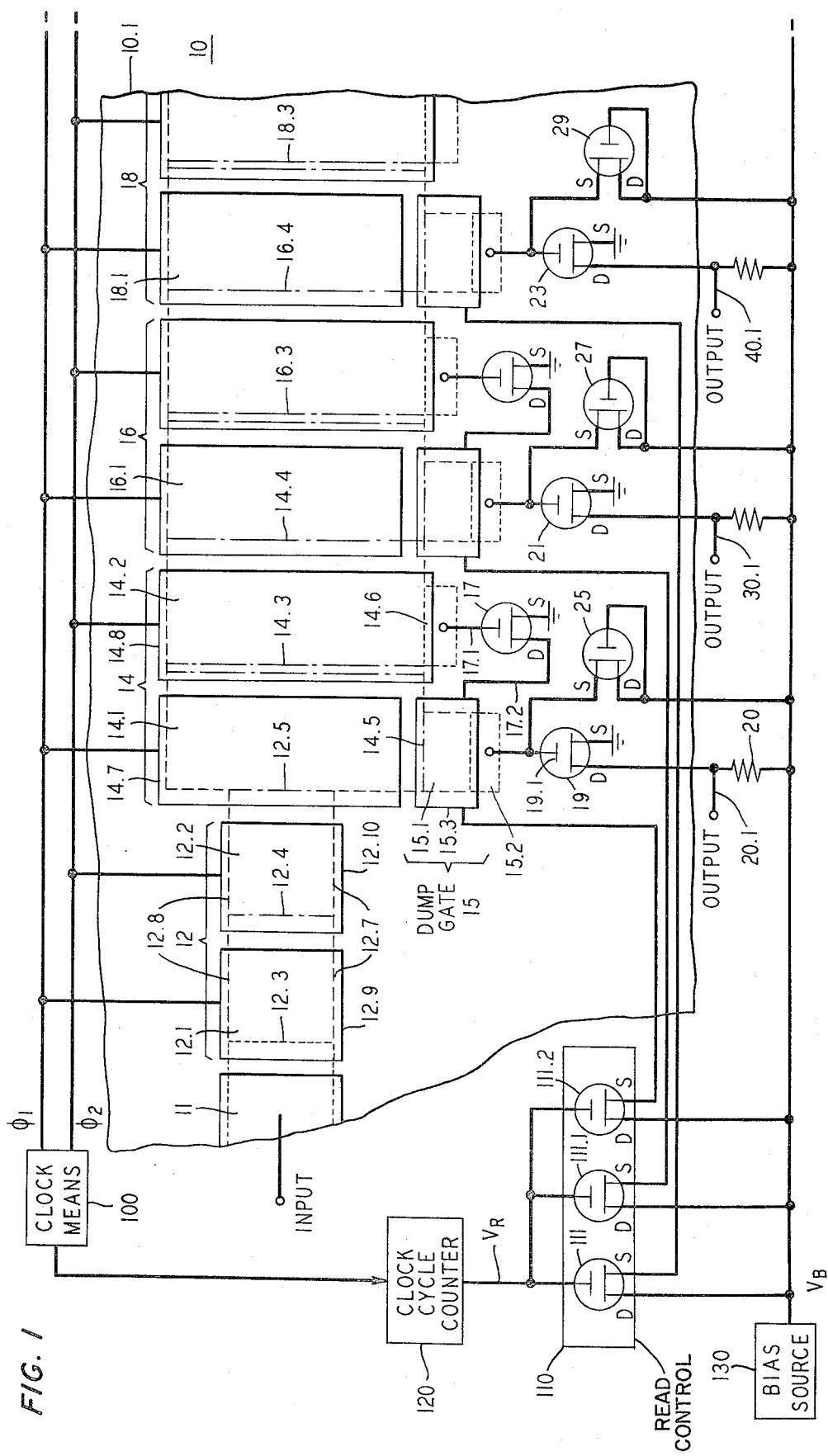
FIG. 1 is a plan view of a binary counter in accordance with an illustrative embodiment of my invention.

Turning now to FIG. 1, there is shown a plan view of a binary counter in accordance with an illustrative embodiment of the invention. The counter 10 comprises a storage medium 10.1 illustratively a $p^-$-type semi-conuctor substrate such as silicon on which is formed an insulative layer (not shown) typically thermally grown silicon dioxide. In the substrate are a plurality of rectangular charge storage cells, the boundaries of which are designated by dashed and dot-dashed lines. These boundaries, termed a barrier lattice, are illustratively established in the substrate by ion implantation or diffusion of stripes of immobile charge (i.e., impurity centers) in the fashion taught in U.S. Pat. No. 3,789,267 issued on Jan. 29, 1974, to R. H. Krambeck and myself.

The barrier lattice is composed of stripes of charge with three different potential heights: (1) chanstop barriers (dashed lines) which are designed to prevent charge transport across them. The object of chanstop barriers, as described in U.S. Pat. No. 3,728,161, issued on Apr. 17, 1973, is to eliminate spurious inversion of the surface of a semiconductor integrated circuit chip due to capacitive coupling between metallization and/or field oxide in the semiconductor substrate. If such coupling were strong enough to invert the surface of the semiconductor, current might leak between adjacent devices or might even short elements of a single device; (2) transfer barriers (dot-dashed lines) which have a height typical of an $n$-channel device; i.e., the application of most positive clock voltage to the barrier region should permit complete transfer of charge. Each transfer barrier is asymmetrically positioned with respect to the center of the overlaying electrode in order to cause charge to flow in a predictable direction; and (3) threshold barriers (dot-dashed double lines) which have a height such that charge is transferred thereacross only if two packets of charge have been transferred into the preceding cell. In addition, the boundaries of diffusion zones for diodes, IGFETs, and the like are shown by dotted lines.

The three types of potential barriers in the lattice define a quantizer 12 and three ($n = 3$) one-bit shift registers 14, 16 and 18 capable of counting the number of charge packets in a particular time interval up to a maximum of $2^n - 1 = 7$. In binary notation the outputs of the shift registers 14, 16 and 18 correspond to the powers of two as follows: $2^0$, $2^1$ and $2^2$, respectively.

The quantizer 12 comprises at least one charge storage cell (hereinafter a "Q-cell") of area A having a charge carrying capacity Q. Thus, each signal pulse to be counted produces a quantum of charge Q in the Q-cell. For reasons discussed later, the quantizer of FIG. 1 comprises first and second Q-cells 12.1 and 12.2 each having an area A and arranged in series relationship. Transfer barriers are located at 12.4 between the first and second Q-cells 12.1 and 12.2, respectively, and at 12.5 between the second Q-cell 12.2 and the first shift register 14. A transfer barrier may also be located at 12.3 if the input device 11 is a charge storage cell of a preceding CCD device. However, if the input device 11 is a diode, as shown, then the interface at 12.3 would designate one edge of an $n^+$-diffusion zone. On the other hand, chanstop barriers are located at 12.7 and 12.8. In addition, a pair of electrodes 12.9 and 12.10 overlay the first and second Q-cells 12.1 and 12.2, respectively, and are connected to opposite phases of two-phase clock means 100.

In a similar fashion the first shift register 14 comprises first and second charge storage cells 14.1 and 14.2 arranged in series relationship. The transfer barrier 12.5 mentioned previously is located between the first cell 14.1 of shift register 14 and the second Q-cell 12.2 of the quantizer 12. A threshold barrier is located at 14.3 between the first and second cells 14.1 and 14.2. Overlaying cells 14.1 and 14.2 are a pair of electrodes 14.7 and 14.8, respectively, connected to opposite phases of clock means 100.

As described more fully hereinafter, in order to clear residual charge from the first cell 14.1 in response to charge transferred across threshold barrier 14.3, a feedback path is established between the first and second cells 14.1 and 14.2. Illustratively, this path includes a conventional grounded source IGFET 17 having its gate electrode 17.1 in contact with an $n^+$-diffusion gate zone 14.6 which is partly overlapped by electrode 14.8. The drain electrode 17.2 actuates a dump gate 15 coupled to the first cell 14.1.

The dump gate 15 comprises a charge storage cell 15.1 adjacent the first cell 14.1 and includes a transfer barrier 14.5 at the interface therebetween. An electrode 15.3 overlays cell 15.1 and is connected to the drain 17.2 of IGFET 17. Charge transferred into the second cell 14.2 of first shift register 14 causes a voltage to be applied to dump gate electrode 15.3 via IGFET 17 and, in turn, causes residual charge to be drained from the first cell 14.1 into dump gate cell 15.1. In order to remove the residual charge from the dump gate, an IGFET diode 25 is utilized as described hereinafter.

In addition, a charge-sensing IGFET has its gate electrode 19.1 connected to the $n^+$-diffusion zone 15.2 which extends under electrode 15.3. The drain of IGFET 19 is connected to a load schematically designated by resistor 20. The voltage at output terminal 20.1, when read at a prescribed time such as the end of a word, corresponds to the first digit of a three-digit binary number. That is, the presence of a voltage at terminal 20.1 corresponds to binary digit $2^0$.

In the interest of brevity a detailed description of the second and third shift registers 16 and 18, and their respective feedback paths, will not be given. It is to be understood that the structure of these components, as well as the circuit connections, are with one exception substantially identical to those previously described with respect to the first shift register 14. The exception is that the third shift register, and in general the $n^{th}$ shift register, need not include a second cell inasmuch as no charge can be transferred across the last threshold barrier if the maximum number of signal pulses in any given word is $2^n - 1$. Accordingly, the $n^{th}$ shift register also need not include a feedback path of the type described.

As mentioned previously, in the quasi-steady state, such as the end of a word, charge residing in the first cell of each shift register is the binary equivalent of the number of pulses in the word. In order to obtain the desired count, a read control 110 is connected to each dump gate. A clock cycle counter 120 is connected to clock means 100, and, after a predetermined number of clock cycles, activates the read control 110. The latter applies a suitable voltage to the dump gate electrodes effective to transfer charge, if any, from the first cells of the shift registers into the dump gate cells. Thereupon, voltages appear at the drains of IGFETs 19, 21 and 23 (i.e., at output terminals 20.1, 30.1 and 40.1) depending on which of the first cells contained charge. IGFET diodes 25, 27 and 29 have their sources connected to the diffusion zones adjacent the dump gate cells of the first, second and third shift registers, respectively, in order to provide a path for the charge in the dump gate cells to flow to the substrate (ground). In conventional fashion, each IGFET diode has its gate and drain shorted to one another and connected to a bias source 130. Thus, reading the presence of charge in the first cell of each shift register also clears these cells in preparation for the next counting operation (e.g., the arrival of the next word). The read and clear operations are described more fully hereinafter.

Assuming that the duration of a clock cycle is equal to the time spacing of adjacent pulse positions, the read operation, performed under the control of counter 120 and read control 110, occurs after an integral number of clock cycles if an even number of Q-cells are used in quantizer 12, but occurs after an integral number of half-cycles if an odd number of Q-cells are used. The precise number of clock cycles after which each read operation is performed depends on design considerations such as the maximum number of pulses in a word, which in turn determines the number $n$ of shift registers required in the counter. In any event, however, the outputs 20.1, 30.1 and 40.1 correspond in binary notation to powers of two as follows: $2^0$, $2^1$ and $2^2$, respectively. Thus, output voltages read on terminals 20.1 and 30.1 but none on terminal 40.1 corresponds to the binary number 110 which equals decimal 3; i.e., the word detected had three pulses.

Operation of the invention will now be described with reference to the schematic drawing of FIGS. 2 and 3. In the interests of clarity of illustration the electrodes have been omitted and the barrier lattice has been shown by solid lines. Corresponding components have been given identical numerical designations in FIGS. 1 and 2. Although the clock means is not shown, it is to be understood that adjacent cells of each shift register are connected to opposite clock phases as in FIG. 1. Note the last shift register 18' has only a first cell 18.1; no second cell or feedback path is required as discussed above. In addition, understanding of the operation of my invention will be facilitated by assuming a preferred embodiment in which the Q-cells of the quantizer each have an area equal to A, the cells of the shift registers have an area equal to 2A, the threshold barriers $V_T$ are equal to 1.5 $V_B$ approximately, and the voltage swing of the clock voltage is equal to $V_B$, approximately (FIG. 3A).

Figure 3A:
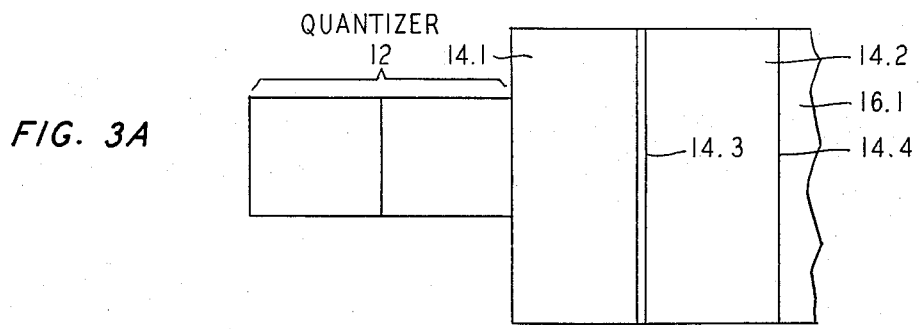
Figure 3B:
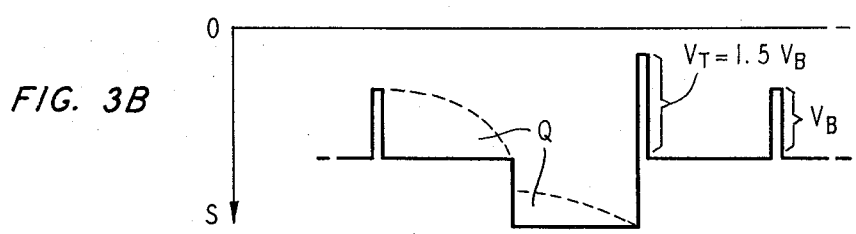
FIGS. 3B–F show the surface potential of the various cells of FIG. 3A at different times during the clock cycle. It has been assumed for convenience that the voltage drop across the insulating layer (oxide) of the storage medium is negligible so that the surface potential(s) is nearly equal to applied voltage.
Figure 3C:
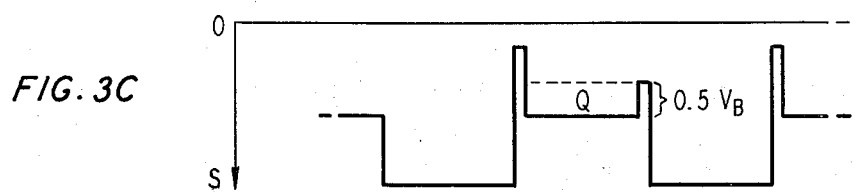

Assume that the input signal is a PCM word having a maximum of seven pulse slots, three of which contain signal pulses. During phase one of the clock cycle, the first signal pulse is applied to quantizer 12 which generates a packet of charge Q in the first Q-cell. By two-phase clocking the packet Q is transferred across transfer barrier 12.4 into the second Q-cell and then across transfer barrier 12.5 into the first cell 14.1 of the first shift register 14. This first packet is temporarily inhibited from further transfer by the threshold barrier 14.3; i.e., due to the larger area (2A) of cell 14.1, the charge Q only half fills the cell. More specifically, an amount of charge Q in a cell of area A decreases the surface potential thereof by an amount equal to $V_B$, whereas the same amount of charge Q in a cell of area 2A will decrease the surface potential by only 0.5 $V_B$. Consequently, during phase two when the threshold barrier is reduced from 1.5 $V_B$ to 0.5 $V_B$, which is equal to the surface potential of cell 14.1, no charge is transferred into cell 14.2 (FIG. 3C).

Figure 3D:
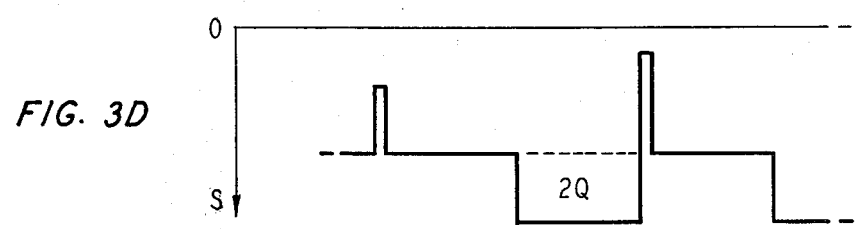
Figure 3E:
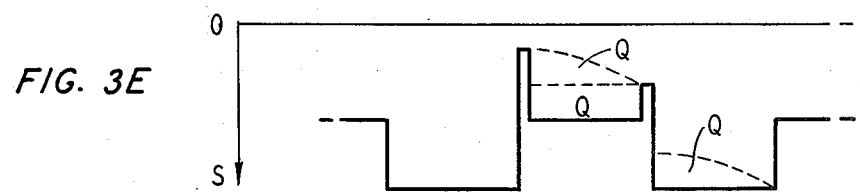
Figure 3F:
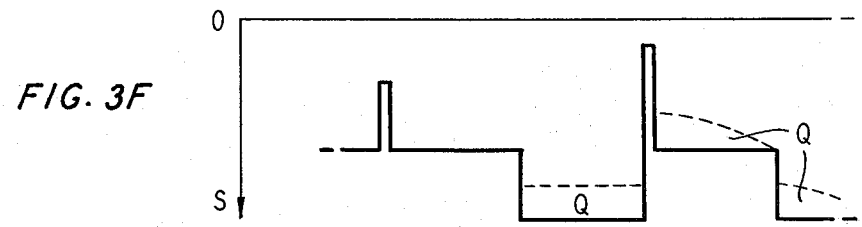

Subsequently, the second signal pulse is applied to quantizer 12 which generates another packet of charge Q in the first Q-cell. By two-phase clocking this second packet of charge Q is similarly transferred through the second Q-cell into the first cell 14.1 where, it will be remembered, the first packet of charge Q is waiting. Charge in the amount of 2Q is now present in the first cell 14.1. This charge decreases the surface potential of the first cell 14.1 by approximately $V_B$ (FIG. 3D). Consequently, during phase two of the clock cycle, when the surface potential under the second cell 14.2 of the first shift register increases by an amount equal to $V_B$ (the clock voltage swing), the effective threshold barrier is reduced from 1.5 $V_B$ to 0.5 $V_B$. Because the surface potential in the first cell 14.1 is smaller by 0.5 $V_B$ than the reduced threshold barrier, half of the 2Q charge (i.e., Q) will transfer into the second cell 14.2 (FIG. 3E) and subsequently into cell 16.1 (FIG. 3F). Therefore, the second cell 14.2 receives charge only after two packets of charge are transferred into the first cell 14.1.

When this process is completed, the first cell 14.1 of the first shift register 14 is still half full; i.e., it contains an amount of charge Q (FIG. 3F). This excess charge is drained off before the next pulse arrives at the first cell 14.1 by means of a feedback path which includes the dump gate 15 and the IGFET inverter 17 (FIG. 2). Briefly, the IGFET inverter 17 is open-circuited by the presence of charge in the second cell 14.2. The resulting increase in its drain voltage opens the dump gate 15. Excess charge in the first cells of the other shift registers, except the last one 18', is cleared in a similar fashion.

During the next half clock cycle, the packet of charge Q in the second cell 14.2 is transferred into the first cell 16.1 of the second shift register where it awaits the arrival of another charge packet. This counting process continues as subsequent charge packets are generated by the quantizer in response to applied signal pulses in the PCM word. Thus, a third charge packet is propagated along the device in the same manner as the first and second charge packets until it reaches the first cell 14.1 where the threshold barrier 14.3 causes it to await the arrival of the next charge pacekt, if any. Inasmuch as it has been assumed that the word contained only three signal pulses, a quasi-steady state is reached (i.e., no further charge propagation occurs). At the end of the word, which may be sensed by counting clock cycles (viz., counter 120, FIG. 1), the read control activates all of the dump gates so that voltages appear on output terminals 20.1 and 30.1 but no voltage appears on terminal 40.1. Thus, the binary output is 110 which equals decimal 3, the number of pulses in the PCM word. After the reading operation is completed, the first cell of each shift register is cleared so that the counter is in condition to count the number of pulses in the next word to arrive.

Figure 2:
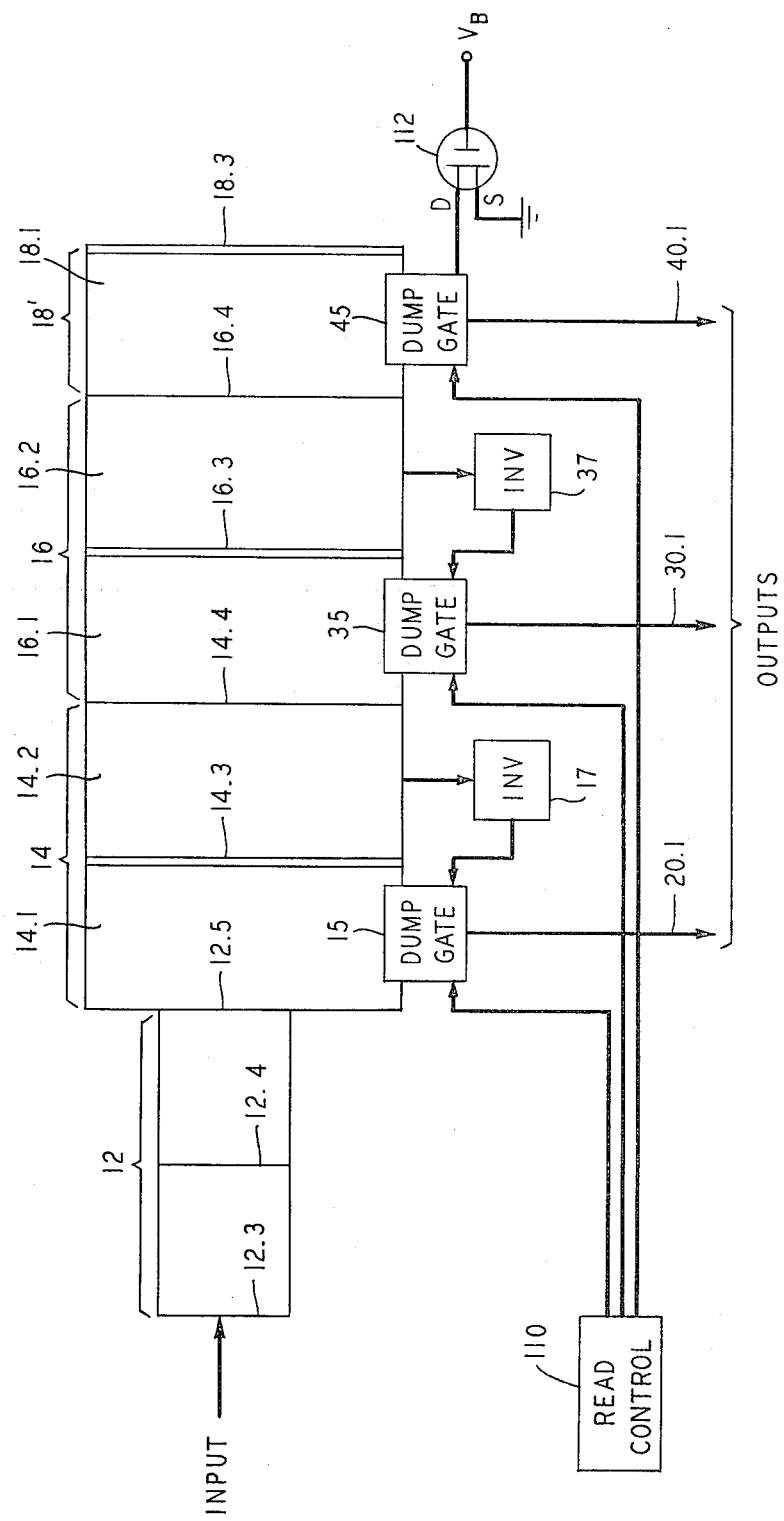
FIG. 2 is a schematic plan view of the binary counter of FIG. 1 in which the electrodes have been omitted for convenience and the barrier lattice configuration is shown by solid lines.

In a similar fashion, any number of charge packets from 0 to 7 in a given word can be counted by the structure of FIG. 2. In general, a larger number of charge packets, up to a maximum of $2^n - 1$, can be counted by utilizing a plurality $n$ of shift registers of the type described.

The reading and clearing operations are described more particularly as follows. The read control 110 includes a plurality of IGFETs, e.g., 111, 111.1 and 111.2, which have their drains connected to source 130 of bias voltage $V_B$, their sources connected to separate dump gate electrodes and their gates connected to the clock cycle counter 120. In practice the IGFETs of the read control may be fabricated on the same chip as the binary counter. Depending on whether a clearing or reading function is to be performed, the clock cycle counter 120 applies one of two voltages $V_R = V_a$ or $V_R = V_b > V_a$ to the gates of the IGFETs of read control 110. Consider IGFET 111.2 for illustrative purposes. For clearing $V_R = V_a$ so that the conductance of IGFET 111.2 has a value $g_R = g_a << g_I$ where $g_I$ is the conductance of the IGFET 17, for example, when no charge is present in cell 14.2. Consequently, the potential on the dump gate 15 is nearly zero and no clearing occurs. When, however, a quantum of charge Q is transferred across threshold barrier 14.3 into cell 14.2, the IGFET 17 is cut-off and the potential on the dump gate 15 is approximately $V_B$ so that clearing of cell 14.1 is accomplished. For reading, on the other hand, in the quasi-steady state no charge is present in cell 14.1 so that IGFET 17 is conducting and has a conductance equal to $g_I$. To read, the clock cycle counter 120 sets $V_R = V_b > V_a$ so that the conductance of IGFET 111.2 now has a value $g_R = g_b >> g_I$. Hence, the potential on the dump gate 15 is approximately $V_B$ and charge in cell 14.1 flows through the channel under the dump gate onto the gate of IGFET 19 producing a signal at output terminal 20.1. In a similar fashion the first cells of the other shift registers are cleared and read.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, although it has been pointed out that the last shift register need not include a "second cell" or a feedback path, it should be noted that in some cases, where the pulse count is high enough, 2Q charge will reach the last cell and Q will be transferred over the last threshold barrier. Thus, it may be desirable to dissipate this transferred charge by coupling a diode, for example, to the last cell of the last shift register.

In addition, in order to provide a path from the read control 110 through the electrode of the last dump gate (e.g., 45 of FIG. 2) to ground, an IGFET 112 has its drain connected to that electrode, its source grounded and its gate connected to the bias source (i.e., $V_B$). Thus, IGFET 112 is always conducting, but functions substantially in the same manner as inverters 17 and 37 in providing continuity to ground.

Moreover, it will be appreciated that the invention, when viewed from a slightly different standpoint, can be considered as comprising a quantizer 12, a plurality $n$ of threshold cells (14.1, 16.1 and 18.1) coupled in tandem with one another each of which has a transfer barrier (12.5, 14.4 and 16.4) at its input and a threshold barrier (14.3, 16.3 and 18.3) at its output. Feedback means (storage cells 14.2 and 16.2, IGFET inverters 17 and 37, and dump gates 15, 35 and 45) are responsive to charge transferred across each threshold barrier for removing residual charge in the threshold cells.

I claim:

1. In a charge transfer binary counter for counting the number of signal pulses in a particular time interval up to a maximum of $2^n - 1$ pulses in the interval, a device comprising:
    a charge storage medium,
    a quantizer comprising first electrode means for forming in said medium at least one charge storage cell adapted to generate a predetermined packet of charge in response to each of said signal pulses,
    second electrode means for forming in said tandem medium a plurality $n$ of charge storage threshold cells coupled in tandem with one another and at least one of which is disposed to receive charge transferred out of said quantizer,
    means for applying clock voltages to said first and second electrode means,
    each of said threshold cells having at its input a first potential barrier across which virtually all charge transferred out of a preceding cell will transfer into said threshold cell upon the application of clock voltage from said applying means to said second electrode means and having at its output a second potential barrier, the area of each threshold cell and the height of its second barrier being mutually adapted in relation to the clock voltage so that charge transfer across the second barrier occurs only when two of said charge packets are transferred into said threshold cell, and
    feeback means responsive to charge transferred across any of the first (n-1) of said second barriers for removing residual charge remaining in the corresponding threshold cells.

2. The device of claim 1 wherein the source of said signal pulses is such that a quasi-steady-state condition is reached during which no additional signal pulses are applied to said quantizer and said clock voltage applying means is effective to cause charge transferred across said threshold barriers to be further transferred into the next succeeding threshold cells, and including means for detecting the presence or absence of such charge in each of said threshold cells, which correspond to the $k^{th}$ binary digit having the decimal equivalent $2^{k-1}$.

3. The device of claim 1 wherein said feedback means includes third electrode means for forming in said medium a plurality of charge storage transfer cells, a transfer cell being positioned between each pair of threshold cells so that charge transferred across the threshold barrier of the preceding cell is collected by the transfer cell, and
control means responsive to charge transferred into said transfer cells for removing residual charge remaining in the threshold cells.

4. The device of claim 3 wherein said control means includes
    dump gate electrode means for forming in said medium a plurality of $n$ charge storage dump cells which are adjacent to separate ones of said $n$ threshold cells,
    a plurality of insulated gate field effect transistors each having source, drain and gate electrodes, the gate electrodes being coupled to respective ones of at least the first (n-1) of said transfer cells and the source or drain electrodes being coupled to respective ones of at least the first ($n-1$) of said dump cells, and
    means for dissipating charge transferred into said dump cells in response to the activation of said transistors by the presence of charge in said transfer cells.

5. The device of claim 4 wherein
    said charge storage medium includes a semiconductor substrate and an insulative layer formed on a major surface thereof, said electrode means being formed on said insulative layer,
    said transistors having their source electrodes connected to said substrate and their drain electrodes coupled to respective ones of said dump cells, and
    said dissipating means comprises a second plurality of insulated gate field effect transistors each having source, drain and gate electrodes, each gate electrode being connected to its drain electrode which is in turn connectable to a source of voltage bias and each source electrode being coupled to a dump cell.

6. The device of claim 4 including
    a clock cycle counter,
    read means responsive to said clock cycle counter for activating said dump cells so that charge in said threshold cells is transferred into said dump cells at the end of said time interval, the presence or absence of charge in the $k^{th}$ one of said dump cells corresponding to the $k^{th}$ binary digit having a decimal equivalent $2^{k-1}$.

7. The device of claim 6 wherein said applying means comprises a two-phase clock voltage means, and including means for coupling alternate ones of said quantizer cells, threshold cells and transfer cells to opposite phases of said clock means.

8. The device of claim 7 wherein said quantizer has an even number of storage cells and said clock cycle counter activates said read means after an integral number of clock cycles.

9. The device of claim 7 wherein said quantizer has an odd number of storage cells and said clock cycle counter activates said read means after an odd integral number of half clock cycles.

10. The device of claim 1 wherein said quantizer-cells each have an area A, said threshold cels each have an area 2A and said second barriers are approximately 1.5 times as large as said first barriers.

11. The device of claim 10 wherein said applying means comprises two-phase voltage clock means, and including means for coupling alternate ones of said quantizer cells to opposite phases of said clock means and for coupling all of said threshold cells to the same phase of said clock means, and wherein the voltage swing of said clock means is equal approximately to the height of said first barriers.

12. in a charge transfer binary counter for counting the number of signal pulses in a particular time interval up to a maximum of $2^n - 1$ pulses in the interval, a device comprising:

a charge storage medium, a quantizer comprising first electrode means for forming in said medium at least one charge storage cell adapted to generate a predetermined packet of charge in response to each of said signal pulses, second electrode means for forming in said medium at least $(n-1)$ shift registers coupled in tandem to one another, means for applying clock voltages to said first and second electrode means, each of said shift registers comprising a charge storage threshold cell and contiguous thereto a charge storage transfer cell, a first potential barrier being located at the input to each threshold cell and a second potential barrier being located at the interface between said threshold and transfer cells, said first barrier adapted to permit virtually complete charge transfer thereacross in response to clock voltage applied thereto from said applying means, and the area of each threshold cell and the height of its second barrier being mutually adapted in relation to the clock voltage so that charge transfers thereacross only if two of said charge packets are transferred into said threshold cell.

each of said shift registers further including feedback means responsive to charge transferred across its second barrier for removing charge remaining in its threshold cell, and a terminal threshold cell coupled to the output of the $(n-1)^{th}$ shift register, another of said second barriers being located at the output of said terminal cell.

13. The device of claim 12 wherein the source of said signals is such that a quasi-steady-state condition is reached during which no additional signal pulses are applied to said quantizer, and said clock voltage applying means is effective to cause charge transferred across the threshold barriers of said shift registers to be further transferred into the next succeeding threshold cells, and including means for detecting the presence or absence of charge in the $k^{th}$ one of said threshold cells, including said terminal cell, which corresponds to the $k^{th}$ binary digit having the decimal equivalent $2^{k-1}$.

14. The device of claim 13 wherein said detecting means includes electrode means for forming a plurality $n$ of charge storage dump cells coupled to separate ones of said threshold cells, a clock cycle counter, read means responsive to said clock cycle counter for activating said dump cells so that charge is transferred from said threshold cells into said dump cells.

15. The device of claim 14 wherein said applying means comprises two-phase clock voltage means and wherein said quantizer cells, threshold cells and transfer cells are coupled to opposite phases of said clock means.

16. The device of claim 14 wherein said feedback means includes in each shift register an insulated gate field effect transistor having source, drain and gate electrodes, the gate electrode being coupled to the transfer cell and one of the source or drain electrodes being coupled to the dump gate adjacent its threshold cell, and means for dissipating charge transferred into said dump cells in response to activation of said transistors by the presence of charge in said transfer cells.

17. The device of claim 12 wherein said quantizer cells each have an area A, said threshold cells of said shift registers each have an area 2A, and said second barriers are approximately 1.5 times as large as said first barrier.

18. The device of claim 17 wherein said applying means comprises two-phase clock voltage means, and including means for coupling alternate ones of said quantizer cells, threshold cells, and transfer cells to opposite phases of said clock means, and wherein the voltage swing of said clock means is equal approximately to the height of said first barriers.

* * * * *